United States Patent
Oooka

(10) Patent No.: US 7,848,113 B2
(45) Date of Patent: Dec. 7, 2010

(54) PRINTED CIRCUIT BOARD, CIRCUIT COMPONENT AND ELECTRONIC APPARATUS

(75) Inventor: Toshiki Oooka, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 12/044,504

(22) Filed: Mar. 7, 2008

(65) Prior Publication Data

US 2008/0239682 A1 Oct. 2, 2008

(30) Foreign Application Priority Data

Mar. 29, 2007 (JP) .............................. 2007-086116

(51) Int. Cl.
*H05K 7/00* (2006.01)
(52) U.S. Cl. .................. 361/747; 361/720; 361/748
(58) Field of Classification Search ................. 361/747, 361/760, 720, 748, 803, 807, 810
See application file for complete search history.

(56) References Cited

U.S. PATENT DOCUMENTS

| | | | | |
|---|---|---|---|---|
| 5,395,099 | A | * | 3/1995 | Hall ............................ 269/47 |
| 6,095,823 | A | * | 8/2000 | Banks .......................... 439/66 |
| 6,404,646 | B1 | * | 6/2002 | Tsai et al. .................... 361/758 |
| 6,642,728 | B1 | * | 11/2003 | Kudo et al. .................. 324/754 |
| 6,728,105 | B2 | * | 4/2004 | Tanaka ........................ 361/704 |

FOREIGN PATENT DOCUMENTS

| | | |
|---|---|---|
| CN | 1495969 A | 5/2004 |
| JP | 2002-184909 | 6/2002 |
| JP | 2004-14721 | 1/2004 |
| JP | 2005-45110 | 2/2005 |

OTHER PUBLICATIONS

Notification of First Office Action with English translation in a corresponding Chinese application dated Jun. 5, 2009, application No. 2008100871539.

* cited by examiner

*Primary Examiner*—Hung S Bui
(74) *Attorney, Agent, or Firm*—Blakely, Sokoloff, Taylor & Zafman LLP

(57) ABSTRACT

According to one embodiment, a printed circuit board is provided with a printed wiring board and a circuit component mounted on the printed wiring board. The printed wiring board includes a first surface on which the circuit component is set, a second surface formed on the reverse side of the first surface, and a through hole formed penetrating the printed wiring board from the first surface to the second surface. The circuit component includes a projected portion to be inserted into the through hole. The projected portion is deformable between a first state in which a distal end of the projected portion projects to the outside of the printed wiring board beyond the second surface and a second state in which the distal end of the projected portion is situated in the through hole.

11 Claims, 7 Drawing Sheets

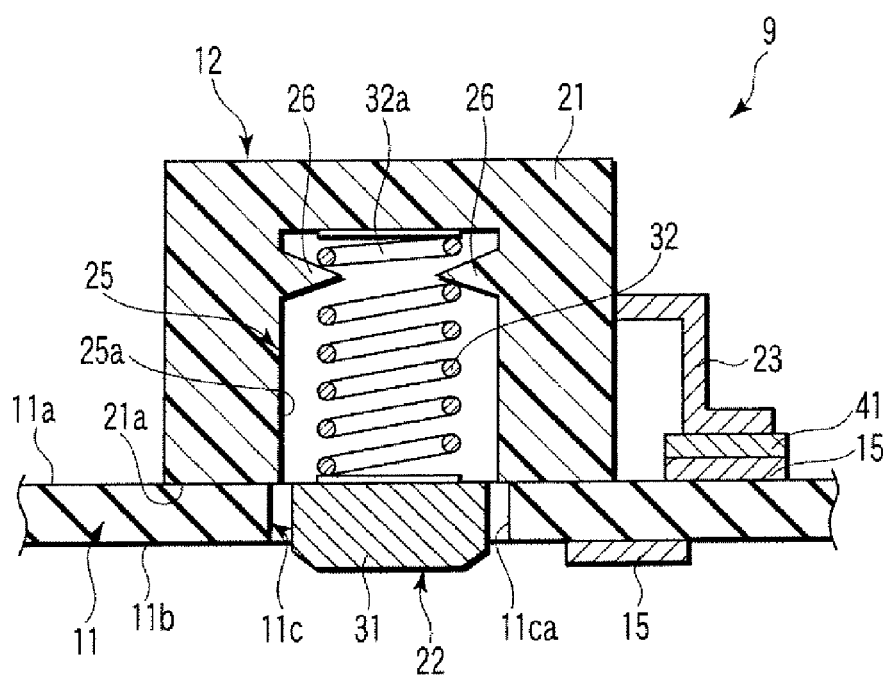
F I G. 4
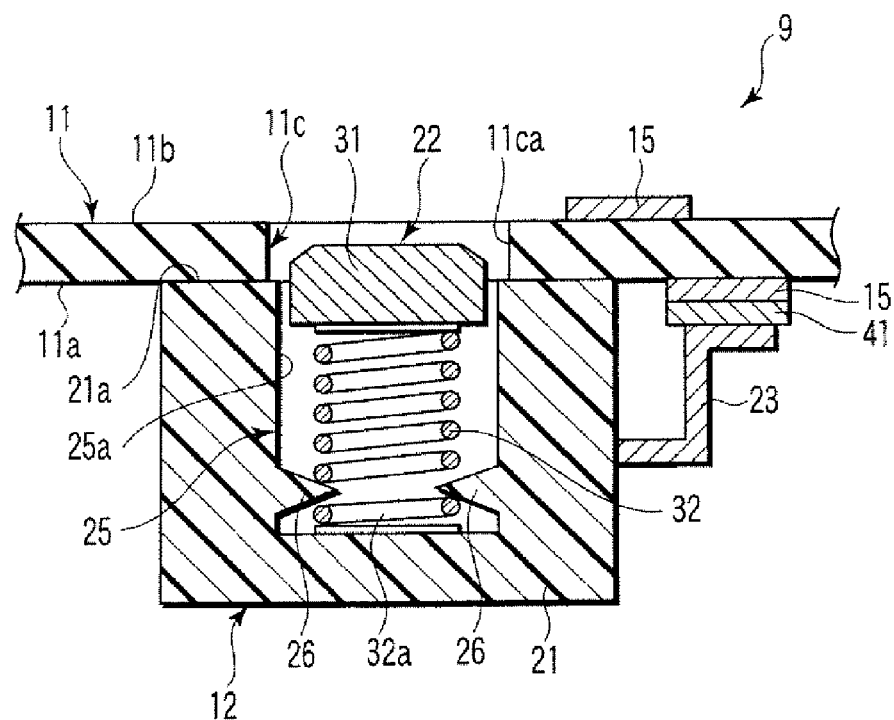
F I G. 5

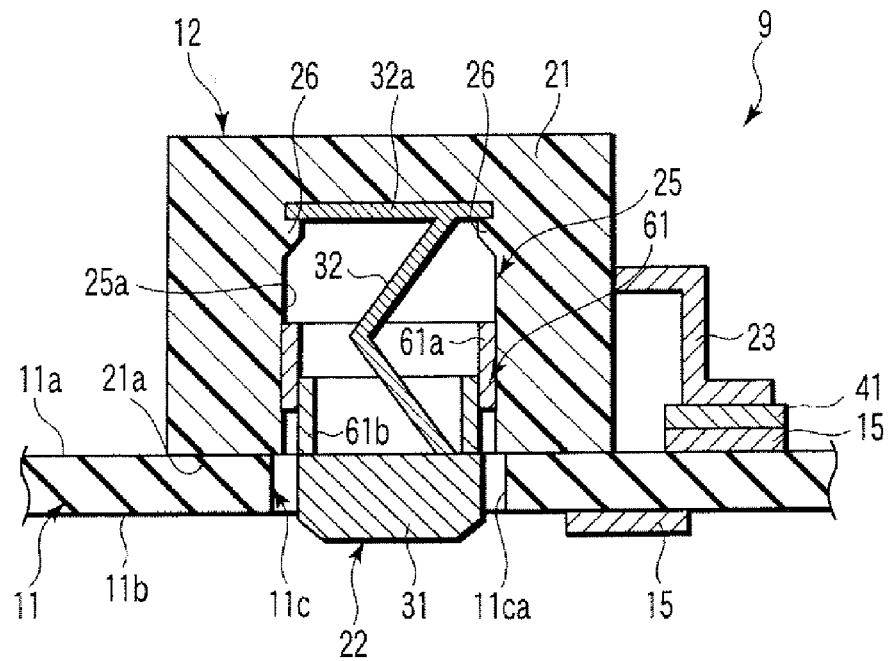
F I G. 9
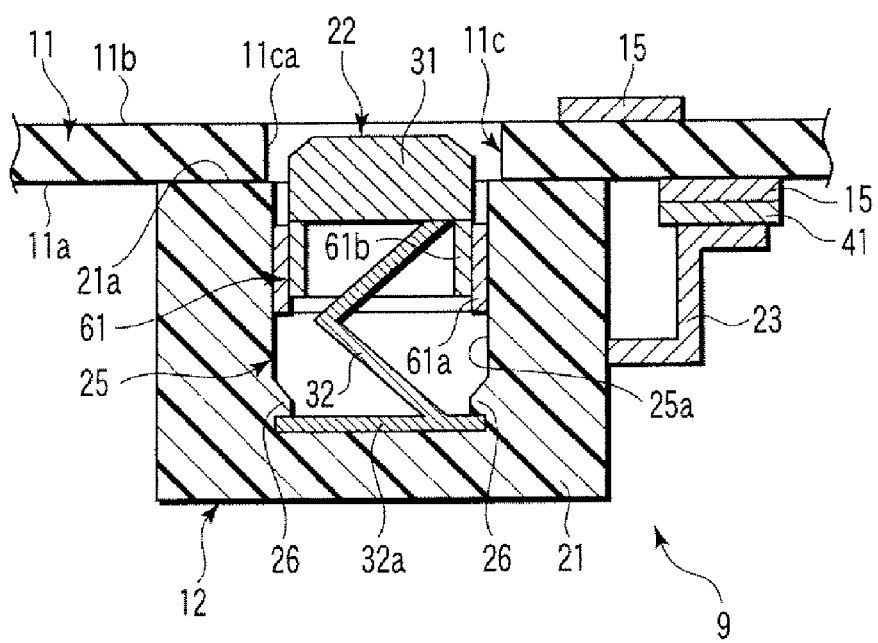
F I G. 10

PRINTED CIRCUIT BOARD, CIRCUIT COMPONENT AND ELECTRONIC APPARATUS

CROSS-REFERENCE TO RELATED APPLICATIONS

This application is based upon and claims the benefit of priority from Japanese Patent Application No. 2007-086116, filed Mar. 29, 2007, the entire contents of which are incorporated herein by reference.

BACKGROUND

1. Field

One embodiment of the invention relates to a circuit component with a projected portion, a printed circuit board and an electronic apparatus which are mounted with the circuit component.

2. Description of the Related Art

In a process for mounting circuit components on a printed wiring board, a solder paste is screen-printed on the wiring board, and the circuit components are set on the board and subjected to reflow processing. In mounting the circuit components on both obverse and reverse surfaces of the wiring board, some of the circuit components are first mounted on the obverse surface of the board in the aforesaid process. Then, the printed wiring board is turned over so that its reverse surface faces upward, the solder paste is printed on the reverse surface, and the other circuit components are set thereon and subjected again to the reflow processing.

In the reflow processing operation, the printed wiring board, carrying the circuit components thereon, is placed on a conveyor. Possibly, therefore, the printed wiring board may be vibrated to cause the circuit components to be dislocated. Further, the circuit components may be dislocated under the influence of a wind in a reflow oven or by the condensation force of the solder paste.

A circuit component that can be positioned with high accuracy is described in Jpn. Pat. Appln. KOKAI Publication No. 2002-184909. This circuit component is provided with a projected portion on the lower surface of a resin mold portion. On the other hand, a printed wiring board on which the circuit component is to be mounted is provided with a through hole corresponding to the projected portion. The circuit component is set on the wiring board in a manner such that its projected portion is inserted into the through hole. Thus, the circuit component can be securely tacked to the wiring board and positioned with high accuracy. In some cases, moreover, the projected portion may be provided on the circuit component in order to improve the mounting efficiency for the component on the wiring board.

Modern printed wiring boards that are mounted in electronic apparatuses, such as portable computers, are becoming thinner and thinner. If a printed wiring board is thin, the projected portion of the circuit component sometimes may penetrate the through hole of the board so that its distal end projects from the reverse surface of the board.

In mounting some circuit components on the reverse surface of the printed wiring board constructed in this manner, the solder paste is bound to be screen-printed on the reverse surface. Thus, if a metal mask for use as a screen plate is placed on the reverse surface of the wiring board, the distal end of the projected portion which projects from the reverse surface comes into contact with the mask. Inevitably, therefore, a gap is formed between the metal mask and the wiring board. If the solder paste is screen-printed with the gap left, the printing accuracy is unavoidably lowered. This adversely affects the reliability of the printed wiring board.

In the case of the thin printed wiring board, therefore, it is difficult to mount the circuit component including the projected portion by reflow processing. Accordingly, some circuit components with the projected portion are usually manually mounted one by one after other components are mounted on the obverse and reverse surfaces. This method, however, requires some improvement in view of manufacturability.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary sectional view showing a first state of the circuit component according to the first embodiment;

FIG. 5 is an exemplary sectional view showing a second state of the circuit component according to the first embodiment;

FIG. 9 is an exemplary sectional view showing a first state of a circuit component according to a third embodiment of the invention;

FIG. 10 is an exemplary sectional view showing a second state of the circuit component according to the third embodiment;

DETAILED DESCRIPTION

Various embodiments according to the invention will be described hereinafter with reference to the accompanying drawings. In general, according to one embodiment of the invention, a printed circuit board is provided with a printed wiring board and a circuit component mounted on the printed wiring board. The printed wiring board includes a first surface on which the circuit component is set, a second surface formed on the reverse side of the first surface, and a through hole formed penetrating the printed wiring board from the first surface to the second surface. The circuit component includes a projected portion to be inserted into the through hole. The projected portion is deformable between a first state in which a distal end of the projected portion projects to the outside of the printed wiring board beyond the second surface and a second state in which the distal end of the projected portion is situated in the through hole.

According to one embodiment of the invention, a circuit component configured to be mounted on a printed wiring board is provided with a setting surface opposed to the printed wiring board and a projected portion protruding from the setting surface. The projected portion being deformable between a first state and a second state in which a distal end of the projected portion is pulled in closer to the setting surface than in the first state.

According to one embodiment of the invention, an electronic apparatus is provided with a case and a printed circuit board housed in the case. The printed circuit board includes a printed wiring board and a circuit component mounted on the printed wiring board. The printed wiring board includes a first surface on which the circuit component is set, a second surface formed on the reverse side of the first surface, and a through hole formed penetrating the printed wiring board from the first surface to the second surface. The circuit component includes a projected portion inserted in the through hole, the projected portion being deformable between a first state in which a distal end of the projected portion projects to the outside of the printed wiring board beyond the second surface and a second state in which the distal end of the projected portion is situated in the through hole.

Embodiments of the present invention that are applied to a printed circuit board mounted in a portable computer will now be described with reference to the accompanying drawings.

Figure 1:
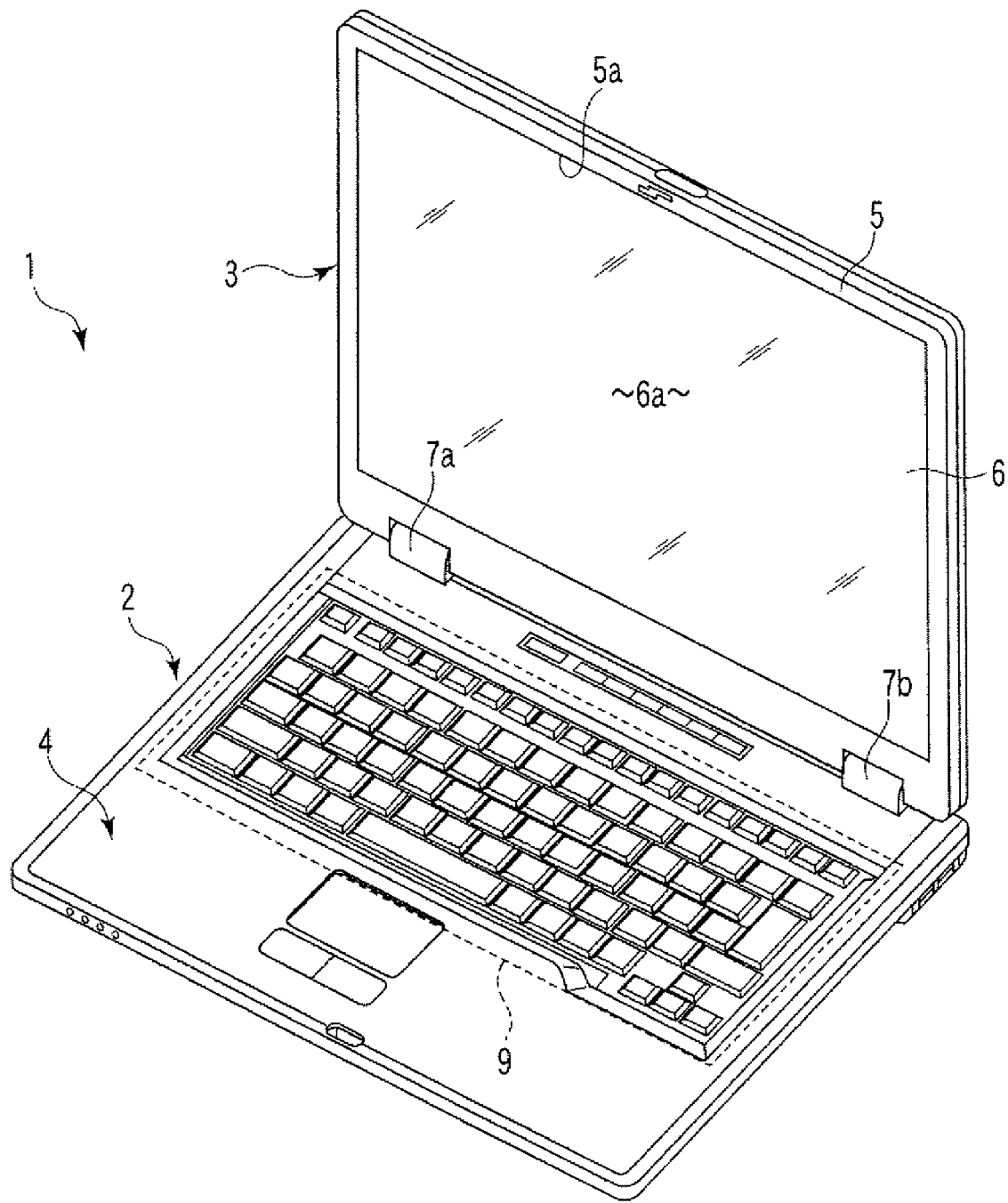
FIG. 1 is an exemplary perspective view of a portable computer according to any of embodiments of the invention.

FIG. 1 shows a portable computer 1 for use as an electronic apparatus according to any of first to fourth embodiments of the invention. As shown in FIG. 1, the portable computer 1 is provided with a main body 2 and a display unit 3.

The main body 2 includes a box-like case 4. The display unit 3 is provided with a display housing 5 and a liquid crystal display module 6 held in the housing 5. The display module 6 includes a display screen 6a. The screen 6a is exposed to the outside of the display housing 5 through an opening 5a in the front face of the housing 5.

The display unit 3 is supported on a rear end portion of the case 4 by a pair of hinge portions 7a and 7b. Thus, the display unit 3 is swingable between a closed position in which it lies flat so as to cover an upper wall of the case 4 from above and an open position in which it stands upright so that the upper wall of the case 4 is exposed.

A printed circuit board 9 according to the first embodiment will now be described with reference to FIGS. 2 to 7. The case 4 of the portable computer 1 contains the printed circuit board 9 for use as a main circuit board. The circuit board 9 includes a printed wiring board 11 and a plurality of circuit components mounted on the wiring board 11. The circuit components on the wiring board 11 include a circuit component 12 that is provided with a projected portion 22.

An example of the circuit component 12 with the projected portion 22 is a relatively large component, among other circuit components mounted on the printed wiring board 11, and may be any of various connectors. An example of the circuit component 12 may be a DDR connector, DDR-2 connector, PCI connector, ExpressCard connector (trademark), or PC card connector.

Circuit components to which the present invention is applicable are not limited to the examples described above, and may be any of a wide variety of circuit components. The "circuit component" as stated herein is a broader term for an electronic component that is mounted on the printed wiring board and functions as a part of the printed circuit board 9. Thus, these various circuit components include electronic components of various types that are mounted on the printed wiring board.

Figure 2:
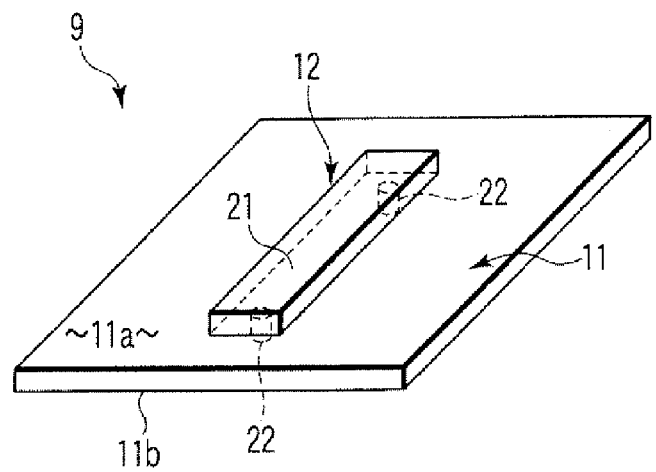
FIG. 2 is an exemplary perspective view of a printed circuit board according to a first embodiment of the invention.

As shown in FIGS. 2 and 4, the printed wiring board 11 has a first surface 11a on which the circuit component 12 is set and a second surface 11b formed on the reverse side of the first surface 11a. Further, a through hole 11c is formed penetrating the wiring board 11 from the first surface 11a to the second surface 11b. The wiring board 11 is a so-called double-sided wiring board of which both obverse and reverse surfaces are mounted with circuit components. The printed wiring board 11 includes wiring patterns (not shown) and pads 15 for use as electrodes on the first and second surfaces 11a and 11b, individually.

Figure 3:
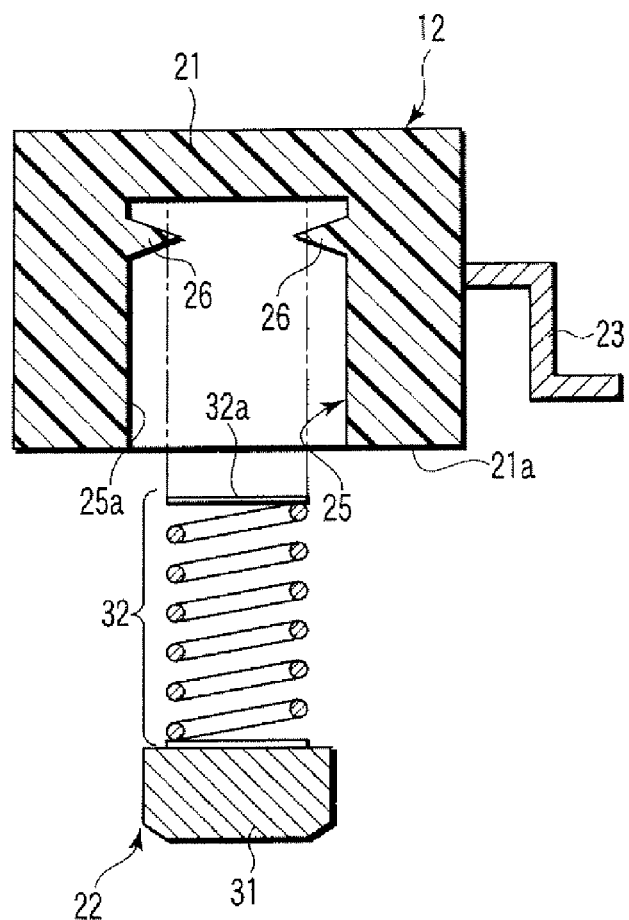
FIG. 3 is an exemplary exploded sectional view of a circuit component according to the first embodiment.

As shown in FIGS. 2 to 4, the circuit component 12 includes a main body portion 21 and the projected portion 22. The greater part of the main body portion 21 is formed of, for example, a molded resin. An example of the molded resin for the body portion 21 is an LCP resin, PPS resin, or PA6T resin. The body portion 21 is provided with leads 23 for use as connection terminals, for example.

The main body portion 21 has a setting surface 21a. The setting surface 21a is opposed to the printed wiring board 11 when the circuit component 12 is mounted on the board 11. The projected portion 22, which protrudes from the setting surface 21a, is inserted into the through hole 11c of the wiring board 11 when the circuit component 12 is mounted on the board 11.

As shown in FIG. 3, a recessed portion 25 is formed in that region of the main body portion 21 which is expected to be provided with the projected portion 22. The recessed portion 25 is recessed from the setting surface 21a toward the interior of the main body portion 21. A locking portion 26 is provided in the inner part of the recessed portion 25. The locking portion 26 is an engaging protrusion that protrudes from an inner surface 25a of the recessed portion 25 into the recessed portion. One or more locking portions 26 may be provided. The locking portion or portions 26 are not particularly limited in shape.

As shown in FIGS. 3 and 4, the projected portion 22 includes a rigid member 31 and an elastic member 32. The rigid member 31 is provided in the distal end portion of the projected portion 22. The rigid member 31 is in the form of, for example, a circular column that is one size smaller than the through hole 11c of the printed wiring board 11, and its distal-side peripheral edge is chamfered. The rigid member 31 is formed of a material that can be distorted less easily than the elastic member 32. An example of the material of the rigid member 31 is brass. However, the material of the rigid member 31 is not limited to this. Further, the rigid member 31 is not restricted to a rigid body. An example of the rigid member 31 has a function as a weight that extends and contracts the elastic member 32.

As shown in FIGS. 3 and 4, the elastic member 32 is provided in the proximal portion of the projected portion 22. An example of the elastic member 32 is a coil spring. An example of the material of the elastic member 32 is SVS, SW-C, or SWP. However, the material of the elastic member 32 is not limited to this. Further, the elastic member 32 is not limited to a coil spring, but may alternatively be a spring of some other type or some other elastic member, such as rubber. One end portion of the elastic member 32 is fixed to the rigid member 31. The other end portion of the elastic member 32 forms a fixed portion 32a that is fixed to the main body portion 21 of the circuit component 12.

More specifically, when the projected portion 22 is press-fitted into that region of the recessed portion 25 which is provided with the locking portions 26, the fixed portion 32a of the elastic member 32 gets over the locking portions 26 and is fixed to the innermost part of the recessed portion. The elastic member 32 elastically supports the rigid member 31.

As shown in FIG. 4, the outside diameter of the rigid member 31 is smaller than the inside diameter of the through hole 11c of the printed wiring board 11. The inside diameter of the through hole 11c is, for example, about 0.2 mm larger than the outside diameter of the rigid member 31.

As shown in FIGS. 4 and 5, the projected portion 22 is elastically deformable between a first state in which its distal end projects to the outside of the printed wiring board 11 beyond the second surface 11b of the board 11 and a second state in which the distal end is situated in the through hole 11c.

FIG. 4 shows the first state of the projected portion 22. The projected portion 22 in the first state is in a so-called extended state. When the projected portion 22 is in the first state, the elastic member 32 is extended, and a part of the rigid member 31 faces an inner surface 11ca of the through hole 11c. Further, another part of the rigid member 31 projects to the outside of the printed wiring board 11 beyond the second surface 11b of the board 11.

The projected portion 22 according to the present embodiment is deformed to the first state by its own weight when the second surface 11b of the printed wiring board 11 is directed downward. Thus, when the rigid member 31 is situated below the elastic member 32, the rigid member 31 serves as a weight to extend the elastic member 32.

FIG. 5 shows the second state of the projected portion 22. The projected portion 22 in the second state is in a so-called contracted state. When the projected portion 22 is in the second state, the elastic member 32 is contracted, and the distal end of the rigid member 31 is situated in the through hole 11c. Specifically, the distal end of the projected portion 22 is retracted into the printed wiring board 11 without projecting to the outside of the board 11 beyond the second surface 11b. In other words, the projected portion 22 can be said to be deformable between the first state and the second state in which its distal end is pulled in closer to the setting surface 21a than in the first state.

The projected portion 22 according to the present embodiment is deformed to the second state by its own weight when the second surface 11b of the printed wiring board 11 is directed upward. Thus, when the rigid member 31 is situated above the elastic member 32, the rigid member 31 serves as a weight to contract the elastic member 32.

The following is a description of an example of a manufacturing method for the printed circuit board 9 on which the circuit component 12 is mounted.

As shown in FIG. 4, the circuit component 12 is mounted on the first surface 11a of the printed wiring board 11. More specifically, a solder paste 41 is first screen-printed on the pads 15 that are provided on the first surface 11a. Then, the circuit component 12 is set on the wiring board 11 so that the leads 23 of the component 12 meet the solder paste 41 spread on the pads 15.

The projected portion 22 is inserted into the through hole 11c as the circuit component 12 is set on the printed wiring board 11. The circuit component 12 can be positioned by doing this. Specifically, the projected portion 22 is extended in the first state in a process for mounting the circuit component 12 on the wiring board 11. When the projected portion 22 is inserted into the through hole 11c, a part of the rigid member 31 faces the inner surface 11ca of the through hole 11c, so that the circuit component 12 can be accurately positioned with respect to the wiring board 11. At about the time that the circuit component 12 is set in place, other circuit components are set on the first surface 11a of the wiring board 11.

After the circuit component 12 is set on the printed wiring board 11, a first cycle of reflow processing is performed so that the solder paste 41 is melted and fixed to the lead 23. In this reflow processing, the circuit component 12 is subjected to external forces, such as a vibration of a conveyor, a wind in a reflow oven, the condensation force of the solder paste 41, etc., which may cause dislocation. In this reflow processing, however, the projected portion 22 is in the first state and is securely locked in the through hole 11c. Thus, the reflow processing can be finished without substantially dislocating the circuit component 12. In this manner, the circuit component 12 can be mounted on the first surface 11a of the wiring board 11.

Then, components are mounted on the second surface 11b of the printed wiring board 11. First, the orientation of the wiring board 11 is reversed so that the second surface 11b is directed upward, as shown in FIG. 5. If the orientation of the wiring board 11 is reversed, the projected portion 22 is deformed from the first state to the second state by its own weight. Thus, the distal end of the projected portion 22 is withdrawn into the through hole 11c of the wiring board 11.

Figure 6:
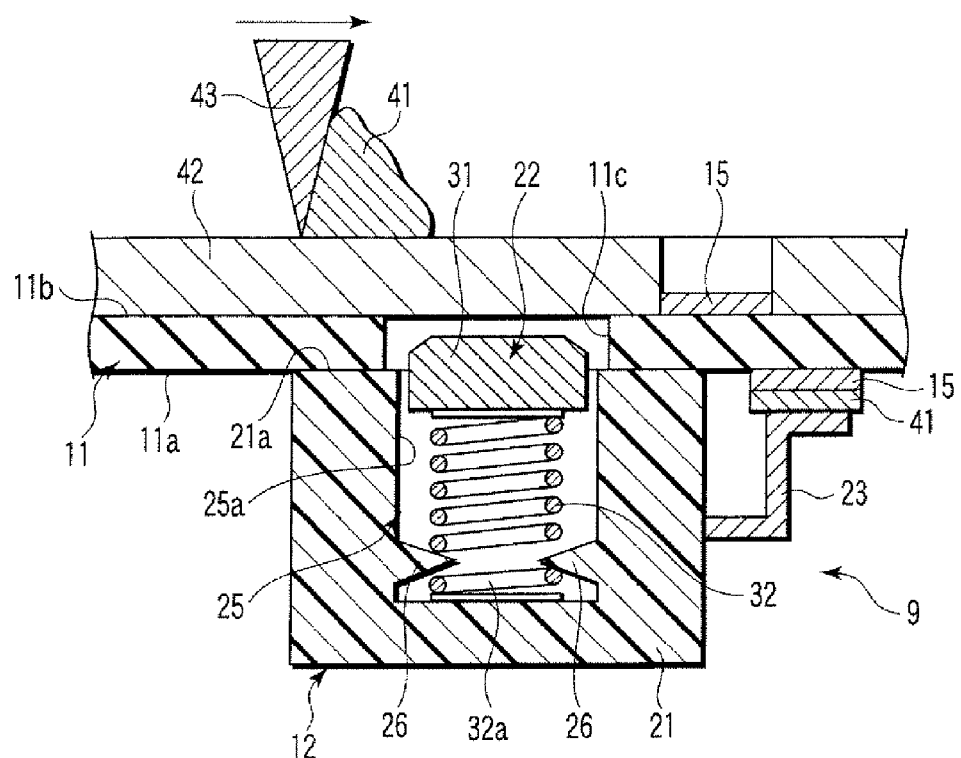
FIG. 6 is an exemplary sectional view showing a printing process for a second surface of a printed wiring board according to the first embodiment.
Figure 7:
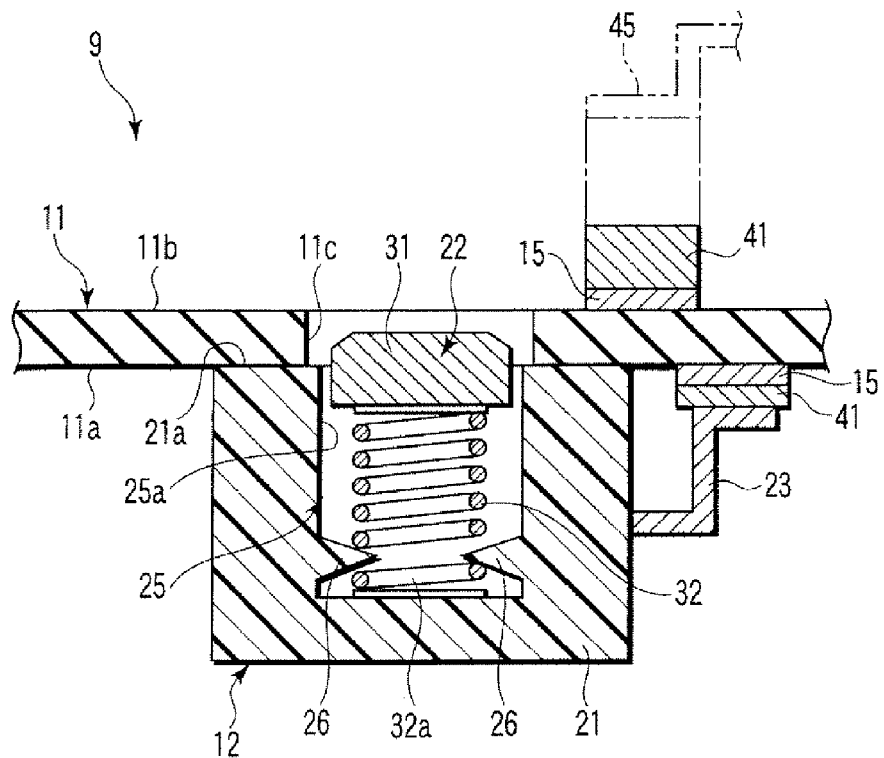
FIG. 7 is an exemplary sectional view showing a mounting process for the second surface of the printed wiring board according to the first embodiment.

After the projected portion 22 is deformed to the second state, the solder paste 41 is screen-printed on the pads 15 that are provided on the second surface 11b. More specifically, as shown in FIG. 6, a metal mask 42 for use as a screen plate is aligned with the second surface 11b, and the solder paste 41 is applied to the second surface 11b by using a squeegee 43. After the solder paste 41 is spread on the second surface 11b, some circuit components 45 are mounted on the second surface 11b, as shown in FIG. 7, and a second cycle of reflow processing is performed. Thus, the circuit components 45 are mounted on the second surface 11b.

The circuit component 12 constructed in this manner improves the manufacturability of the printed circuit board 9. If the projected portion 22 is deformable between the first and second states, it is locked in the through hole 11c to activate a dislocation prevention function in a mounting process for the circuit component 12. Further, the projected portion 22 is deformed to the second state in the component mounting process for the second surface 11b. Thus, the metal mask 42 can be closely joined to the second surface 11b of the printed wiring board 11 without being impeded by the projected portion 22.

If the metal mask 42 can be joined to the second surface 11b of the printed wiring board 11 without being impeded by the projected portion 22, non-soldered defective, a short circuit by sagging or the like cannot be easily caused. Therefore, the circuit component 12 can be mounted on the first surface 11a by the reflow processing. More specifically, the circuit component 12 that is provided with the projected portion 22 can be mounted together with other circuit components on the thin wiring board 11 by the reflow processing. In other words, the circuit component 12 can be pre-installed. Thus, the circuit component 12 with the projected portion 22 need not be singly mounted by hand in a later process, that is, a later process for manual installation or the like can be curtailed. This helps improve the manufacturability of the printed circuit board 9 and reductions in the manufacturing cost and time, in particular.

Some examples of the thin printed wiring board 11 have a thickness of 0.65 mm or less. The projected portion of the circuit component 12 may be formed thinner than the wiring board 11. If the projected portion of the circuit component 12 is made thinner than the thin wiring board 11, however, an allowance for engagement between the projected portion of the circuit component 12 and the through hole 11*c* is short, so that the projected portion may possibly fail to fulfill its dislocation prevention function.

Specifically, the projected portion with a height of projection small enough to be confined within the thin printed wiring board 11 may possibly fail to contribute satisfactorily to accurate positioning of the circuit component 12, allowing the component 12 to be carried away by wind during the reflow processing, for example. The "engagement allowance" is an area in which the projected portion 22 and the through hole 11*c* face each other.

On the other hand, the projected portion 22 of the present embodiment is configured so that its distal end projects to the outside of the printed wiring board 11 beyond the second surface 11*b* when in the first state. If its distal end projects to the outside of the printed wiring board 11 the projected portion 22 cannot easily slipping out of the through hole 11*c*, so that it can fulfill its dislocation prevention function for the circuit component 12.

If the projected portion 22 is deformable, as in the present embodiment, moreover, the circuit component 12 can be generally used for a plurality of types of printed wiring boards 11 that are different in thickness. Thus, it is unnecessary to standardize the circuit component 12 to fit the thickness of the printed wiring board 11 according to the type of the wiring board. Accordingly, few standardized circuit components 12 of, for example, one type can deal with a plurality of types of printed wiring boards 11 with different thicknesses. This contributes to a reduction in the development cost of the printed circuit board 9.

The projected portion 22 need not always be elastically deformed between the first and second states. If the projected portion 22 is elastically deformed, however, the circuit component 12 can be manually aligned in position. Thus, the projected portion 22 is contracted to the second state if it is located along the surface of the printed wiring board 11 in order to align the circuit component 12 in position. When the projected portion 22 faces the through hole 11*c*, it is returned to the first state by an elastic force and caused to engage the through hole 11*c*. Thus, if the circuit component 12 can be manually aligned in position, a manufacturing process for the printed circuit board 9 may be made flexible, so that the manufacturability of the board 9 may be improved.

If the rigid member 31 is provided in that part of the projected portion 22 which faces the through hole 11*c*, the projected portion 22 can be locked more securely in the through hole 11*c* than in the case where the distal end portion of the projected portion 22 is formed of a flexible member. Thus, the rigid member 31 serves to improve the dislocation prevention function of the projected portion 22.

If the projected portion 22 is can be deformed between the first and second states by its own weight, it need not be pushed in or pulled, so that the manufacturability of the printed circuit board 9 is enhanced. If the rigid member 31 is utilized as a weight, the projected portion 22 that is deformed between the first and second states by its own weight can be formed relatively easily.

A printed circuit board 9 according to a second embodiment of the invention will now be described with reference to FIG. 8. Like numbers are used to designate like portions that have the same functions as those of the printed circuit board 9 according to the first embodiment, and a description of those portions is omitted. The circuit board 9 of the second embodiment differs from that of the first embodiment in the shape of a projected portion 22 of a circuit component 12. Configurations other than those described below are the same as their counterparts in the first embodiment.

Figure 8:
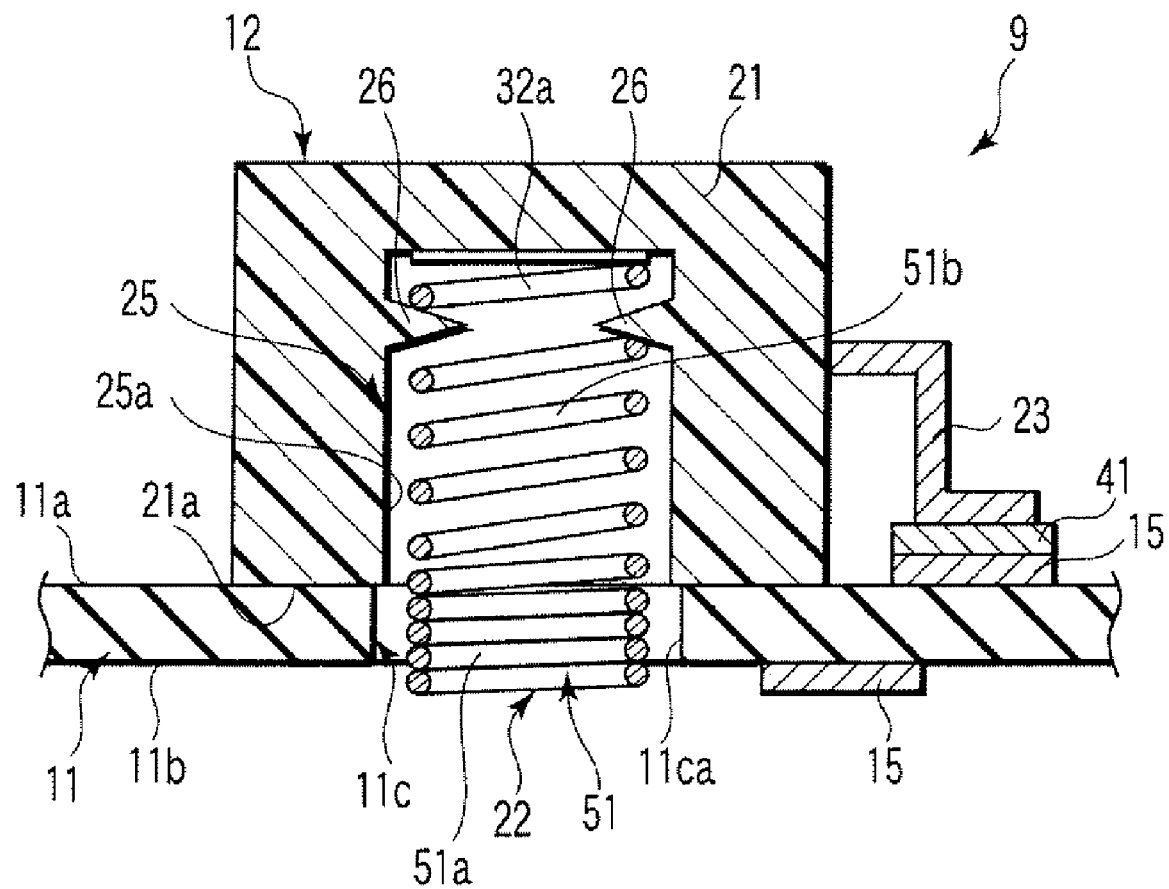
FIG. 8 is an exemplary sectional view of a circuit component according to a second embodiment of the invention.

As shown in FIG. 8, the projected portion 22 includes an elastic member 51. An example of the elastic member 51 is a coil spring. An example of the material of the elastic member 51 is SVS, SW-C, or SWP. One end portion of the elastic member 51 forms a fixed portion 32*a* that is fixed to a main body portion 21 of the circuit component 12. In the coil spring that forms the elastic member 51, as shown in FIG. 8, coil pitches at a distal end portion 51*a* are smaller than coil pitches at another part. In other words, the distal end portion 51*a* of the elastic member 51 is wound closer than a proximal portion 51*b*.

The projected portion 22, like that of the first embodiment, is elastically deformable between a first state in which its distal end projects to the outside of a printed wiring board 11 beyond a second surface 11*b* of the board 11 and a second state in which the distal end is situated in a through hole 11*c*.

When the projected portion 22 is in the first state, the elastic member 51 is extended, and the closely wound distal end portion 51*a* faces an inner surface 11*ca* of the through hole 11*c*. In other words, the pitches of that part of the projected portion 22 which faces the inner surface 11*ca* of the through hole 11*c* in the first state are smaller than the pitches of the other portion. The projected portion 22 of the present embodiment is elastically deformed between the first and second states by its own weight.

The circuit component 12 constructed in this manner improves the manufacturability of the printed circuit board 9. If the projected portion 22 is deformable between the first and second states, it fulfills its dislocation prevention function and cannot easily constitute a hindrance to a component mounting process for the second surface 11*b*. Thus, the circuit component 12 that is provided with the projected portion 22 can be mounted together with other circuit components by reflow processing, so that the manufacturability of the printed circuit board 9 can be improved.

If the projected portion 22 is formed of one elastic member 51, as in the present embodiment, it can be obtained by only attaching the elastic member 51 to the main body portion 21, so that the assemblability of the projected portion 22 is high. If the pitches of that part of the projected portion 22 which faces the inner surface 11*ca* of the through hole 11*c* in the first state are smaller than the pitches of the other part, the closely formed distal end portion of the projected portion 22 can be securely locked in the through hole 11*c*. Thus, the dislocation prevention function for the circuit component 12 can be improved.

A printed circuit board 9 according to a third embodiment of the invention will now be described with reference to FIGS. 9 and 10. Like numbers are used to designate like portions that have the same functions as those of the printed circuit board 9 according to the first embodiment, and a description of those portions is omitted. The circuit board 9 of the third embodiment differs from that of the first embodiment in the shape of a projected portion 22 of a circuit component 12. Configurations other than those described below are the same as their counterparts in the first embodiment.

As shown in FIG. 9, the projected portion 22 includes a rigid member 31, an elastic member 32, and a support member 61. An example of the elastic member 32 is a leaf spring (i.e., flat spring). An example of the material of the elastic member 32 is SVS, SW-C, or SWP. A fixed portion 32*a* that is fixed to a main body portion 21 of the circuit component 12 is provided in one end portion of the elastic member 32. The other end portion of the elastic member 32 abuts and presses the rigid member 31 toward the outside of a printed wiring board 11.

The support member 61 includes an outer pipe 61a attached to an inner surface 25a of a recessed portion 25 and an inner pipe 61b movable inside the outer pipe 61a. One or more inner pipes 61b may be provided. The inner pipe or pipes 61b are movable for a predetermined distance with respect to the outer pipe 61a. The innermost inner pipe 61b is fixed to the rigid member 31 and configured to advance or retreat together with the rigid member 31. The inner pipe or pipes 61b are prevented from being displaced beyond the predetermined distance with respect to the outer pipe 61a.

As shown in FIGS. 9 and 10, the projected portion 22, like that of the first embodiment, is elastically deformable between a first state in which its distal end projects to the outside of the printed wiring board 11 beyond a second surface 11b of the board 11 and a second state in which the distal end is situated in a through hole 11c. The projected portion 22 according to the present embodiment is elastically deformed between the first and second states by its own weight.

The support member 61 is deformed as the rigid member 31 is displaced between the first and second states and supports the rigid member 31 lest it slip out of the main body portion 21.

The circuit component 12 constructed in this manner improves the manufacturability of the printed circuit board 9. If the projected portion 22 is deformable between the first and second states, it fulfills its dislocation prevention function and cannot easily constitute a hindrance to a component mounting process for the second surface 11b. Thus, the circuit component 12 that is provided with the projected portion 22 can be mounted together with other circuit components by reflow processing, so that the manufacturability of the printed circuit board 9 can be improved.

Since the flat spring can be manufactured by punching, it is better in manufacturability than the coil spring. Further, the flat spring is easier to handle than the coil spring that is liable to hitch on something during assembly. If the elastic member 32 is formed of the flat spring, moreover, the projection height of the projected portion 22 can be easily adjusted by changing the thickness or bending amount of the elastic member. Thus, the projected portion 22 that uses the flat spring has various advantages over the one that uses the coil spring.

A printed circuit board 9 according to a fourth embodiment of the invention will now be described with reference to FIGS. 11 and 12. Like numbers are used to designate like portions that have the same functions as those of the printed circuit boards 9 according to the first and third embodiments, and a description of those portions is omitted. The circuit board 9 of the fourth embodiment differs from that of the first embodiment in the shape of a projected portion 22 of a circuit component 12. Configurations other than those described below are the same as their counterparts in the first embodiment.

Figure 11:
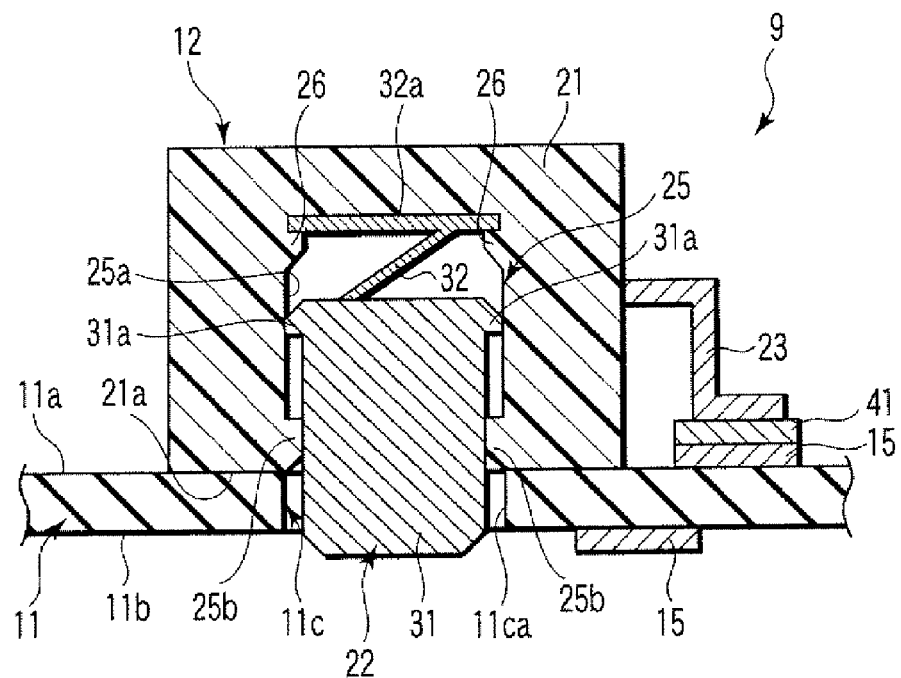
FIG. 11 is an exemplary sectional view showing a first state of a circuit component according to a fourth embodiment of the invention.

As shown in FIG. 11, the projected portion 22 includes a rigid member 31 and an elastic member 32. An example of the elastic member 32 is a leaf spring. A fixed portion 32a that is fixed to a main body portion 21 of the circuit component 12 is provided in one end portion of the elastic member 32. The other end portion of the elastic member 32 abuts and presses the rigid member 31 toward the outside of a printed wiring board 11.

The rigid member 31 includes a first locking portion 31a. The first locking portion 31a projects radially outward from the outer periphery of the rigid member 31. On the other hand, a second locking portion 25b is provided in a part of a recessed portion 25. The second locking portion 25b projects from an inner surface 25a of the recessed portion 25 toward the interior of the recessed portion 25. The first and second locking portions 31a and 25b face each other.

The rigid member 31 is configured to be press-fitted into the recessed portion 25. The first locking portion 31a of the rigid member 31 in the recessed portion 25 faces the second locking portion 25b lest the rigid member 31 slip out of the recessed portion 25.

Figure 12:
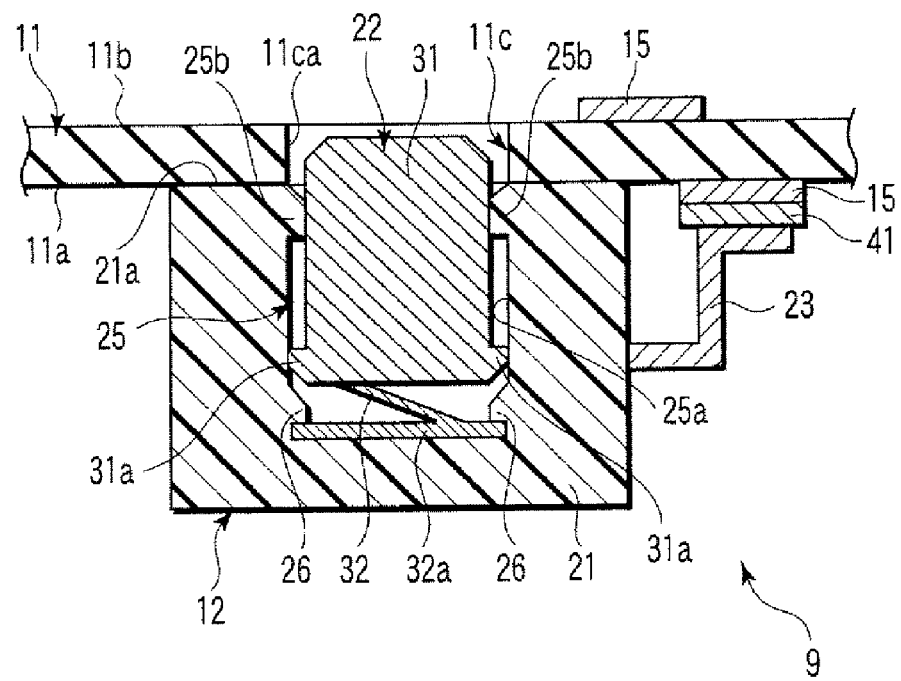
FIG. 12 is an exemplary sectional view showing a second state of the circuit component according to the fourth embodiment.

As shown in FIGS. 11 and 12, the projected portion 22, like that of the first embodiment, is elastically deformable between a first state in which its distal end projects to the outside of the printed wiring board 11 beyond a second surface 11b of the board 11 and a second state in which the distal end is situated in a through hole 11c. The projected portion 22 according to the present embodiment is elastically deformed between the first and second states by its own weight.

The circuit component 12 constructed in this manner improves the manufacturability of the printed circuit board 9. If the projected portion 22 is deformable between the first and second states, it fulfills its dislocation prevention function and cannot easily constitute a hindrance to a component mounting process for the second surface 11b. Thus, the circuit component 12 that is provided with the projected portion 22 can be mounted together with other circuit components by reflow processing, so that the manufacturability of the printed circuit board 9 can be improved.

Although there have been described the portable computer 1 according to any of the embodiments of the present invention and the printed circuit boards 9 according to the first to fourth embodiments mounted therein, the invention is not limited to these embodiments. The configurations according to the first to fourth embodiments may be combined as required.

For example, the projected portion 22 need not always be deformed by its own weight but may alternatively be deformed between the first and second states by an external force.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed circuit board comprising:
 a printed wiring board; and
 a circuit component on the printed wiring board,
 the printed wiring board including a first surface on which the circuit component is set, a second surface being on the reverse side of the first surface, and a through hole penetrating the printed wiring board from the first surface to the second surface,
 the circuit component including a recessed portion, a projected portion attached in the recessed portion, and a locking portion fixing a first end portion of the projected portion in the recessed portion, the projected portion being inserted in the through hole and deformable between a first state in which a second end portion of the projected portion projects to the outside of the printed wiring board beyond the second surface and a second state in which the second end portion of the projected portion is situated in the through hole.

2. The printed circuit board according to claim 1, wherein the projected portion is elastically deformed between the first and second states.

3. The printed circuit board according to claim 2, wherein the projected portion includes a rigid member provided in the second end portion of the projected portion and an elastic member which elastically supports the rigid member, and a part of the rigid member faces an inner surface of the through hole when the projected portion is in the first state.

4. The printed circuit board according to claim 2, wherein the projected portion is deformed to the second state by the own weight of the projected portion when the second surface of the printed wiring board is directed upward.

5. The printed circuit board according to claim 2, wherein the projected portion includes a coil spring of which coil pitches at that part which faces an inner surface of the through hole in the first state are smaller than coil pitches at another part.

6. The printed circuit board according to claim 1, wherein the projected portion includes a coil spring and the locking portion is inserted between rings of the coil spring.

7. An electronic apparatus comprising:
a case;
a printed wiring board in the case; and
a circuit component on the printed wiring board, wherein
the printed wiring board including a first surface on which the circuit component is set, a second surface being on the reverse side of the first surface, and a through hole penetrating the printed wiring board from the first surface to the second surface,
the circuit component including a recessed portion, a projected portion attached in the recessed portion, and a locking portion fixing a first end portion of the projected portion in the recessed portion, and
the projected portion being inserted in the through hole, and deformable between a first state in which a second end portion of the projected portion projects to the outside of the printed wiring board beyond the second surface and a second state in which the second end portion of the projected portion is situated in the through hole.

8. The electronic apparatus according to claim 7, wherein the projected portion comprises a coil spring and the locking portion is inserted between rings of the coil spring.

9. The electronic apparatus according to claim 7, wherein the projected portion is elastically deformed between the first and second states.

10. The electronic apparatus according to claim 9, wherein the projected portion is deformed to the second state by the own weight of the projected portion when the second surface of the printed wiring board is directed upward.

11. The electronic apparatus according to claim 7, wherein the projected portion comprises a rigid member provided in the second end portion of the projected portion and an elastic member which elastically supports the rigid member, and a part of the rigid member faces an inner surface of the through hole when the projected portion is in the first state.

* * * * *